United States Patent [19]

Luttner et al.

[11] Patent Number: 4,843,452
[45] Date of Patent: Jun. 27, 1989

[54] THYRISTER HOUSING GATE LEAD AND METHOD OF MANUFACTURING SAME

[75] Inventors: Richard J. Luttner; Ronald J. Yurko, both of County of Westmoreland, Pa.

[73] Assignee: Latronics Corporation, Latrobe, Pa.

[21] Appl. No.: 115,397

[22] Filed: Nov. 2, 1987

[51] Int. Cl.[4] .................. H01L 23/48; H01L 29/40; H01L 29/44
[52] U.S. Cl. ......................... 357/68; 357/74; 357/79
[58] Field of Search ............... 357/79, 74, 68; 29/460, 29/589; 437/221, 222, 215, 216, 218, 208, 209, 212

[56] References Cited

U.S. PATENT DOCUMENTS 4,420,869 12/1983 Erkan et al. .................. 29/460

FOREIGN PATENT DOCUMENTS 3316964 11/1984 Fed. Rep. of Germany ........ 357/79

Primary Examiner—Rolf Hille
Assistant Examiner—S. V. Clark
Attorney, Agent, or Firm—Buchanan Ingersoll

[57] ABSTRACT

A thyrister housing gate lead and a method for its manufacture effectively prevents the accumulation of entrapped solutions within the gate lead without causing other damage to the thyrister housing. A gate lead is closed at the interior end situated within the thyrister housing. The closed end can be pinched to form a generally flattened surface which extends inward from the ceramic insulator. Because the interior end of the gate lead is closed, solution entrapment within the gate lead is prevented. Futhermore, the closed end provides an easily accessible and reliable surface for soldering to the gate electrode wire. Alternatively, a hole can be bored through the generally flattened end and the gate electrode wire can be wrapped therein.

7 Claims, 1 Drawing Sheet

THYRISTER HOUSING GATE LEAD AND METHOD OF MANUFACTURING SAME

BACKGROUND OF THE INVENTION

1. Field of the Invention

The present invention relates to gate leads for use in thyrister housings and methods for manufacturing the same. More particularly, the present invention relates to gate leads having a permanent closed end located within the thyrister housing.

2. Description of the Prior Art

Gate leads are provided in thyrister housings so as to permit an electrical passageway from outside the thyrister to a semiconductor located within the hermetically sealed ceramic-insulated unit. Erkan et al, U.S. Pat. No. 4,420,869, discloses the common method of manufacturing a thyrister housing having a gate lead. The gate lead is brazed into a hole located on a side of the thyrister housing. Because the gate lead is hollow, the attachment of the lead to the hole in the thyrister housing is maintained and an open end within the thyrister housing which is accessible to soldering with the gate electrode wire from the thyrister semiconductor is provided.

After the gate lead is attached to the thyrister housing, the housing undergoes further cleaning and plating operations. If the gate lead is left open, cleaning and plating solutions may become entrapped within the hollow lead. This can cause corrosion of the gate lead, poor solderability with the gate electrode wire, semiconductor failure, and poor gate current carrying operation. To prevent these occurrences, the gate lead is temporarily plugged or capped at the open end within the thyrister housing before the cleaning and plating of the thyrister housing. However, both plugging and capping the gate lead create problems.

The plugs which are used to close the one end of the gate lead sometimes fall out during the subsequent cleaning and plating operations. This will permit the cleaning and plating solutions to become entrapped within the hollow tube. When a frangible cap is used to close the open end of the gate lead, as disclosed in Erkan et al., the cap must be pierced in order to solder the gate electrode wire within the gate lead. Not only is the frangible cap difficult to pierce, but the conductive cap may flake into the thyrister package after it has been pierced, causing damage, arcing, or a short to occur in the thyrister. Additionally, the pierce operation is time consuming. Moreover, the interior diameter of the gate lead provides a poor solderability surface even under the best of conditions when no cleaning or plating solutions are present. This is due to the difficult nature of plating a blind hole when air is entrapped during the submersion process. Accordingly, there remains a need for a method of manufacturing a thyrister housing gate lead which will effectively prevent the accumulation of entrapped solutions without causing other damage to the thyrister housing, or additional labor during assembly of the semiconductor to the ceramic insulation package.

SUMMARY OF THE INVENTION

In accordance with the present invention, there is provided a thyrister housing gate lead which is closed at the interior end situated within the thyrister housing. Preferably, this end is generally flattened and pinched to extend inward from the ceramic insulator. The closed end then provides a solderable surface for attaching the gate electrode wire. Additionally, a hole can be punched through the generally flattened end and the gate electrode wire can be wrapped therethrough. Because the interior end of the gate lead is closed, solution entrapment within the gate lead is prevented. Furthermore, the questionable solderable surface of the interior diameter of the gate lead has been replaced by the easily accessible and more reliable exterior closed end, nickel-plated surface.

Alternatively, the gate lead can be closed by a plate from which a tab extends. The tab can be bent inward from the thyrister housing to provide a solderable surface for attaching the gate electrode wire. Additionally, a hole can be pierced into the tab and the gate electrode wire can be wrapped therethrough.

In a final embodiment, a steel plug is brazed into the interior end of the gate lead. The plug is partially inserted to provide a solderable surface for the attachment of a gate electrode wire. Additionally, a hole can be drilled into the steel plug and the gate electrode wire can wrap therethrough.

DESCRIPTION OF THE PREFERRED EMBODIMENTS

Figure 1:
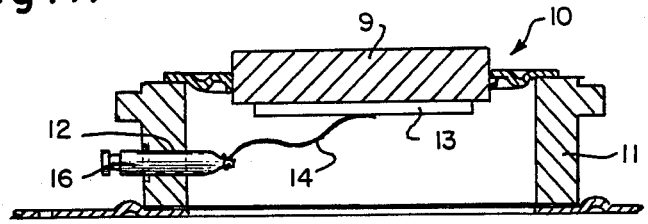
FIG. 1 is a cross-sectional view of a thyrister housing showing the gate lead of the present invention.

As shown in FIG. 1, thyrister 10 is formed of thyrister housing 11 having bore 12 located in one side. Semiconductor 13 rests on the copper heat sink 9 of the thyrister housing 11. Gate electrode wire 14 extends from semiconductor 13 and is attached to a gate lead assembly 16 which is inserted into bore 12.

Typically, gate lead assembly 16 is formed from an elongated hollow Kovar tube. The tube is hollow to more closely approximate the thermal expansion and contraction of brazed bore 12. This provides the necessary hermetic seal to the interior of the thyrister. The hollow tube also provides a surface to which the gate electrode wire 14 can be soldered.

Figure 2:
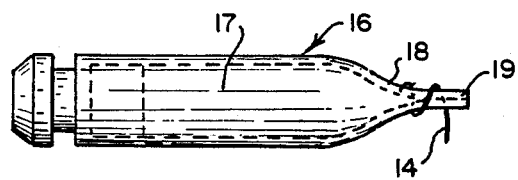
FIG. 2 is a side elevational view of the gate lead of the present invention.

FIG. 2 shows one embodiment of our new gate lead assembly 16. We provide Kovar tube 17 which is hollow throughout most of its length, including that portion which is in contact with brazed bore 12. The end 18 of tube 17 which is within the thyrister housing is closed. Closed end 18 provides a permanent seal to the hollow Kovar tube 17. This seal prevents cleaning and plating solutions from depositing within the Kovar tube 17. Furthermore, closed end 18 provides a surface to which gate electrode wire 14 can be wrapped and soldered. Closed end 18 provides a soldered joint that eases visual inspection for joint integrity over the previous method of inspecting inside bore 12.

Closed end 18 provides a more advantageous soldering surface than the inner diameter of metal tube 17. Closed end 18 is much more accessible to a soldering gun than the inside diameter of metal tube 17. This easier access allows for a more reliable solder joint. More importantly, closed end 18 is more removed for the thyrister housing than the inside diameter of metal tube 17. Because the thyrister housing is a ceramic insulator, it is a heatsinking mass. Because closed end 18 is more removed from the housing, less time and energy are needed to solder gate electrode wire 14. This provides a much stronger mechanical solder joint than use of the inner diameter of the metal tube 17.

Preferably, closed end 18 is formed by pinching the interior end of metal tube 17 to form a generally flattened end 19 as shown in FIG. 2. Gate electrode wire 14 is wrapped around generally flattened end 19 and soldered thereto. Because the exterior of metal tube 17 is a much more accessible soldering surface than the interior diameter of metal tube 17, less energy and time are consumed soldering the gate electrode wire to the soldering surface. Furthermore, a much stronger solder joint results because of the exterior soldering surface.

Figure 3:
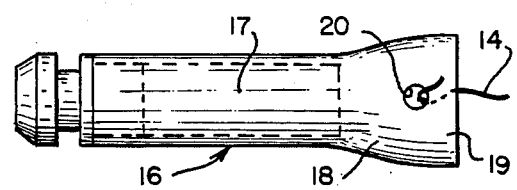
FIG. 3 is a top elevational view of the gate lead of FIG. 2 showing a further enhancement.

Alternatively, as shown in FIG. 3, a lateral hole 20 can be punched or pierced through the generally flattened end 19 of gate tube assembly 16. Gate electrode wire 14 can be wrapped through hole 20 and then soldered to generally flattened end 19. This will provide an even more reliable solder joint.

Figure 4:
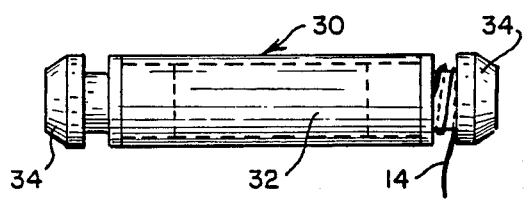
FIG. 4 is a side elevational view of an alternate embodiment of the gate lead of the present invention.
Figure 5:
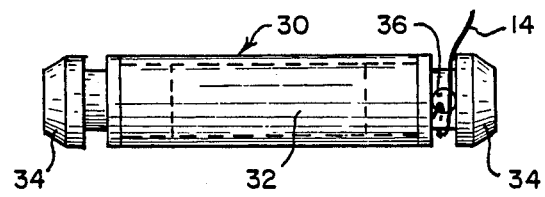
FIG. 5 is a side elevational view of the gate lead of FIG. 4 showing a further enhancement.

In addition to the gate electrode assembly shown in FIGS. 2 and 3, other assemblies can be used which permanently seal the hollow metal gate tube. Typical examples are shown in FIGS. 4–7. As shown in FIGS. 4 and 5, gate tube assembly 30 includes hollow tube 32 into the interior end of which steel plugs 34 are inserted. Gate electrode wire 14 wraps around steel plug 34 and can be soldered thereto. Alternatively, lateral hole 36 can be drilled into steel plug 34. Gate electrode wire 14 can be wrapped through hole 36 and then soldered to steel plug 34.

Figure 6:
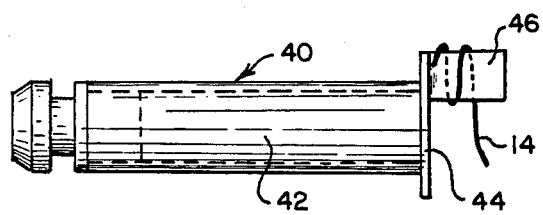
FIG. 6 is a side elevational view of an alternate embodiment of the gate lead of the present invention.
Figure 7:
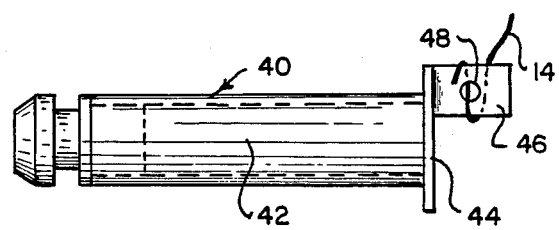
FIG. 7 is a side elevational view of the gate lead of FIG. 6 showing a further enhancement.

As shown in FIGS. 6 and 7, gate tube assembly 40 includes hollow tube 42 and cover plate 44 which is attached onto the interior end of tube 42. Tab 46 is connected to cover plate 44 and is bent inward into the thyrister housing. Gate electrode wire 14 wraps around tab 46 and can be soldered thereto. Alternatively, lateral hole 48 can be punched or pierced into tab 46. Gate electrode wire 14 can be wrapped through hole 48 and then soldered to tab 46.

While we have shown and described a present preferred embodiment of the invention, it is to be distinctly understood that the invention is not limited thereto but may be otherwise variously embodied and practiced within the scope of the following claims.

We claim:

1. An apparatus comprising a thyrister housing, a bore in said housing, a semiconductor located within said housing, and a gate lead assembly, said gate lead assembly comprising a hollow metal tube extending through said bore to the interior of said housing, the interior portion of said gate lead assembly being closed, said closed portion comprising a solderable surface for a gate electrode wire from said semiconductor, said gate electrode wire being directly connected to said solderable surface.

2. The apparatus of claim 1 wherein said tube has an interior end, said interior end being closed by pinching the end of said tube provide a flattened end of said tube, said flattened end providing said solderable surface.

3. The apparatus of claim 2 including a lateral hole located in said flattened end to provide said solderable surface.

4. The apparatus of claim 1 including a cover plate attached to said metal tube, a flanged tab attached to said cover plate, said tab being bent inward from said thyrister housing to provide said solderable surface.

5. The apparatus of claim 4 including a lateral hole located on said tab to provide said solderable surface.

6. The apparatus of claim 1 wherein said tube has an interior end, including a steel plug brazed into the interior end of said metal tube, said plug providing said solderable surface.

7. The apparatus of claim 6 including a lateral hole located on said plug to provide said solderable surface.

* * * * *

UNITED STATES PATENT AND TRADEMARK OFFICE
CERTIFICATE OF CORRECTION

PATENT NO. : 4,843,452

DATED : June 27, 1989

INVENTOR(S) : RICHARD J. LUTTNER, RONALD J. YURKO

It is certified that error appears in the above-identified patent and that said Letters Patent is hereby corrected as shown below:

Column 1, line 37, change "one" to --open--.

Signed and Sealed this

Twenty-fourth Day of April, 1990

Attest:

HARRY F. MANBECK, JR.

*Attesting Officer*  *Commissioner of Patents and Trademarks*